(12) United States Patent
Xiong et al.

(10) Patent No.: US 10,289,229 B2
(45) Date of Patent: May 14, 2019

(54) TOUCH PANEL WITH REDUCED ELECTROMAGNETIC INTERFERENCE

(71) Applicants: Shanghai Tianma AM-OLED Co., Ltd., Shanghai (CN); Tianma Micro-Electronics Co., Ltd., Shenzhen (CN)

(72) Inventors: Zhiyong Xiong, Shanghai (CN); Qijun Yao, Shanghai (CN); Dong Qian, Shanghai (CN)

(73) Assignees: SHANGHAI TIANMA AM-OLED CO., LTD., Pudong Dist., Shanghai (CN); TIANMA MICRO-ELECTRONICS CO., LTD., Futian District, Shenzhen (CN)

( * ) Notice: Subject to any disclaimer, the term of this patent is extended or adjusted under 35 U.S.C. 154(b) by 0 days.

(21) Appl. No.: 16/112,773

(22) Filed: Aug. 27, 2018

(65) Prior Publication Data
US 2018/0364847 A1 Dec. 20, 2018

Related U.S. Application Data

(63) Continuation-in-part of application No. 14/638,184, filed on Mar. 4, 2015.

(30) Foreign Application Priority Data

Oct. 13, 2014 (CN) .......................... 2014 1 0538192

(51) Int. Cl.
*G06F 3/041* (2006.01)
*G06F 3/044* (2006.01)
*H01L 27/32* (2006.01)

(52) U.S. Cl.
CPC ............ *G06F 3/0412* (2013.01); *G06F 3/044* (2013.01); *H01L 27/323* (2013.01);
(Continued)

(58) Field of Classification Search
USPC ...................... 345/173–178; 178/18.01–20.04
See application file for complete search history.

(56) References Cited

U.S. PATENT DOCUMENTS 8,624,868 B2 * 1/2014 Chang ..................... G06F 3/044
345/173
9,165,992 B2 * 10/2015 Chang ................. H01L 27/3262
(Continued)

FOREIGN PATENT DOCUMENTS

CN 102830827 A 12/2012

*Primary Examiner* — Chad M Dicke
(74) *Attorney, Agent, or Firm* — Faegre Baker Daniels LLP

(57) ABSTRACT

Provided is a touch panel. The touch panel includes a first substrate and a second substrate disposed opposite to each other; a plurality of stacks separated by a pixel definition layer and each including an anode block and an organic light emitting block; a plurality of cathodes; a plurality of strip-shaped first touch electrodes arranged in a first direction and each extending in a second direction; and a plurality of strip-shaped second touch electrodes arranged in the second direction and each extending in the first direction. The first touch electrodes may arranged on the same layer with the anodes or arranged on the same layer with the cathodes, and are directly on the pixel definition layer. A projection of the strip-shaped first touch electrode is located between projections of two adjacent cathodes.

7 Claims, 16 Drawing Sheets

(52) U.S. Cl.
CPC ............ *H01L 27/3246* (2013.01); *G06F 2203/04103* (2013.01); *G06F 2203/04107* (2013.01); *G06F 2203/04111* (2013.01)

(56) References Cited

U.S. PATENT DOCUMENTS

| | | | |
|---|---|---|---|
| 9,383,846 B2 | 7/2016 | Furukawa et al. | |
| 9,568,761 B2* | 2/2017 | Wu | G02F 1/13338 |
| 10,001,876 B2* | 6/2018 | Li | G06F 3/0416 |
| 10,088,930 B2* | 10/2018 | Huo | G06F 3/0412 |
| 2006/0208629 A1 | 9/2006 | Kijima et al. | |
| 2008/0224604 A1 | 9/2008 | Satou et al. | |
| 2009/0242283 A1 | 10/2009 | Chiu | |
| 2011/0157093 A1 | 6/2011 | Bita et al. | |
| 2012/0169636 A1 | 7/2012 | Liu | |
| 2012/0249454 A1* | 10/2012 | Teraguchi | G06F 3/0412 345/173 |
| 2013/0033439 A1* | 2/2013 | Kim | G02F 1/13338 345/173 |
| 2013/0050130 A1* | 2/2013 | Brown | G06F 3/044 345/174 |
| 2013/0307800 A1 | 11/2013 | Cheng et al. | |
| 2014/0225838 A1* | 8/2014 | Gupta | G06F 3/0412 345/173 |
| 2014/0326968 A1* | 11/2014 | Lee | H01L 27/323 257/40 |
| 2015/0015765 A1 | 1/2015 | Lee | |
| 2015/0042612 A1* | 2/2015 | Lee | G02F 1/13338 345/174 |
| 2015/0169121 A1* | 6/2015 | Yao | G06F 3/0412 345/174 |
| 2015/0185915 A1* | 7/2015 | Lim | G06F 3/044 345/174 |
| 2015/0380467 A1* | 12/2015 | Su | H01L 27/323 257/40 |
| 2016/0085364 A1* | 3/2016 | Lee | G06F 3/0412 345/174 |
| 2016/0103536 A1 | 4/2016 | Xiong et al. | |
| 2016/0124557 A1* | 5/2016 | Choi | G06F 3/0412 345/173 |
| 2016/0195961 A1* | 7/2016 | Ludden | G06F 3/0412 345/174 |
| 2017/0010734 A1* | 1/2017 | Liu | G06F 3/044 |
| 2017/0075452 A1* | 3/2017 | Kim | G06F 3/044 |
| 2017/0090644 A1* | 3/2017 | Yao | G06F 3/0416 |
| 2017/0097714 A1* | 4/2017 | Lee | G02F 1/13338 |
| 2017/0108979 A1* | 4/2017 | Lu | G06F 3/041 |
| 2017/0213873 A1* | 7/2017 | Bok | H01L 27/323 |
| 2017/0269745 A1* | 9/2017 | Ding | G06F 3/0412 |
| 2018/0143729 A1* | 5/2018 | Lee | G06F 3/0416 |

* cited by examiner

TOUCH PANEL WITH REDUCED ELECTROMAGNETIC INTERFERENCE

CROSS-REFERENCE TO RELATED APPLICATION

This application is a continuation-in-part of U.S. application Ser. No. 14/638,184, filed on Mar. 4, 2015, which claims priority to Chinese Application No. CN201410538192.1, filed on Oct. 13, 2014, which are herein incorporated by reference in their entireties.

TECHNICAL FIELD

The present disclosure relates to the field of display technologies, and particularly to a touch panel, a manufacturing method thereof and a display device.

BACKGROUND

An Active Matrix Organic Light Emitting Diode (AMOLED) possesses characteristics such as self-illumination, low consumption, fast response, high contrast and wide viewing angle. Therefore, the AMOLED has a wide application prospect in the field of display technologies.

With development of display technologies, a touch structure is integrated in an AMOLED display panel to achieve a touch control function. In the related art, the touch structure is typically integrated in the AMOLED display panel in an On-Cell manner in order for the touch control function of the AMOLED display panel. However, in such AMOLED display panels with the touch structure integrated in the On-Cell manner, electromagnetic interference occurs between the touch structure and a display structure during operation of the AMOLED display panel, and hence a display effect and a touch control effect of the AMOLED display panel are affected; moreover, the above integration by the On-Cell manner includes lots of manufacturing processes and results in a high production cost.

SUMMARY

In view of the above, embodiments of the present disclosure provide a touch panel, a manufacturing method thereof and a display device to reduce or avoid the electromagnetic interference between a touch structure and a display structure, the lots of manufacturing processes and the high production cost of the AMOLED display panel having a touch control function integrated in the On-Cell manner of the related art.

In a first aspect, embodiments of the present disclosure provide a touch panel, including:
  a first substrate and a second substrate disposed opposite to each other;
  a plurality of anode blocks arranged on the second substrate, where the plurality of anode blocks are arranged in rows and columns and are separated by a pixel definition layer;
  a plurality of organic light emitting blocks, each of which is disposed on a respective one of the plurality of anode blocks, where the plurality of organic light emitting blocks are separated by the pixel definition layer;
  a plurality of cathode blocks, each of which is disposed on a respective one of the plurality of organic light emitting blocks;
  a plurality of strip-shaped first touch electrodes arranged in a first direction and each extending in a second direction; and
  a plurality of strip-shaped second touch electrodes arranged in the second direction and each extending in the first direction;
  where the plurality of cathode blocks and the plurality of strip-shaped first touch electrodes are arranged in a same layer, each of the plurality of strip-shaped first touch electrodes is located between two adjacent columns of cathode blocks, the plurality of strip-shaped first touch electrodes are directly on the pixel definition layer, and the first direction is substantially perpendicular to the second direction.

In a second aspect, embodiments of the present disclosure provide a touch panel, including:
  a first substrate and a second substrate disposed opposite to each other;
  a plurality of anode blocks arranged on the second substrate, where the plurality of anode blocks are arranged in rows and columns and are separated by a pixel definition layer;
  a plurality of organic light emitting blocks, each of which is disposed on a respective one of the plurality of anode blocks, where the plurality of organic light emitting blocks are separated by the pixel definition layer;
  a plurality of strip-shaped cathodes arranged in a first direction and each extending in a second direction;
  a plurality of strip-shaped first touch electrodes arranged in the first direction and each extending in the second direction; and
  a plurality of strip-shaped second touch electrodes arranged in the second direction and each extending in the first direction;
  where the plurality of strip-shaped cathodes and the plurality of strip-shaped first touch electrodes are arranged in a same layer, each of the plurality of strip-shaped first touch electrodes is located between two adjacent ones of the plurality of strip-shaped cathodes, and the first direction is substantially perpendicular to the second direction.

In a second aspect, embodiments of the present disclosure provide a touch panel, including:
  a first substrate and a second substrate disposed opposite to each other;
  a plurality of anode blocks arranged on the second substrate, where the plurality of anode blocks are arranged in rows and columns and are separated by a pixel definition layer;
  a plurality of organic light emitting blocks, each of which is disposed on a respective one of the plurality of anode blocks, where the plurality of organic light emitting blocks are separated by the pixel definition layer;
  a plurality of cathodes;
  a plurality of strip-shaped first touch electrodes arranged in a first direction and each extending in a second direction; and
  a plurality of strip-shaped second touch electrodes arranged in the second direction and each extending in the first direction;
  where the plurality of anode blocks and the plurality of strip-shaped first touch electrodes are arranged in a same layer, each of the plurality of strip-shaped first touch electrodes is located between two adjacent columns of anode blocks, the plurality of strip-shaped first touch electrodes are covered by the pixel definition layer, and the first direction is substantially perpendicular to the second direction.

In a fourth aspect, embodiments of the present disclosure further provide a display device, including the touch panel described in the above first aspect to the third aspect.

As for the touch panel, manufacturing method thereof and display device provided by embodiments of the present disclosure, by at least disposing the first touch layer achieving touch control function between the first substrate and the second substrate, disposing the cathode into a strip shape, and disposing the projection, on the second substrate, of the first touch sub-electrode on the first touch layer between two adjacent cathodes, at least electromagnetic interference between the first touch layer and the cathode can be reduced, so that display effect and touch control effect may be improved. In addition, the first touch layer and the cathode (or anode) may be formed by an evaporation process since the cathode (or anode) is also disposed between the first substrate and the second substrate, thus reducing not only manufacturing processes but also production cost.

While multiple embodiments are disclosed, still other embodiments of the present disclosure will become apparent to those skilled in the art from the following detailed description, which shows and describes illustrative embodiments. Accordingly, the drawings and detailed description are to be regarded as illustrative in nature and not restrictive.

BRIEF DESCRIPTION OF THE DRAWINGS

Features, objects and advantages of the present disclosure will become apparent by the detailed description of non-restrictive embodiments made by referring to the accompanying drawings listed below.

Figure 1A:
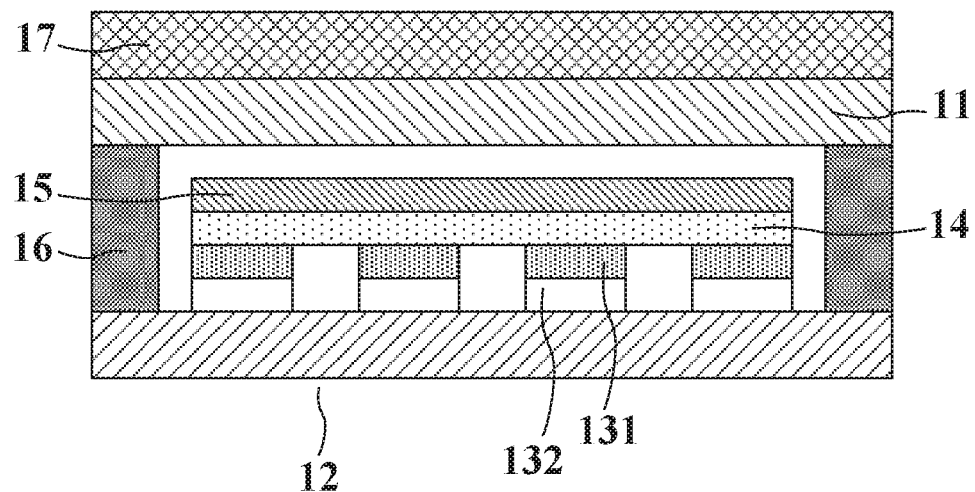
FIG. 1A is a schematic diagram showing the structure of an AMOLED display panel in the related art.

While the embodiments described in the disclosure are amenable to various modifications and alternative forms, specific embodiments have been shown by way of example in the drawings and are described in detail below. The intention, however, is not to limit the disclosure to the particular embodiments described. On the contrary, the disclosure is intended to cover all modifications, equivalents, and alternatives falling within the scope of the appended claims.

DETAILED DESCRIPTION

The present disclosure is further described in detail below in combination with the accompany drawings and embodiments. It shall be understood that the specific embodiments described here are used for description in the present disclosure rather than for limiting the present disclosure in any way. It should be further noted that only parts of but not all content of the present disclosure are shown in the accompany drawings for the sake of description.

With development of display technologies, a touch structure is integrated in an AMOLED display panel to achieve a touch control function. In the related art, the touch structure is integrated in the AMOLED display panel in an On-Cell manner to implement the touch control function of the AMOLED display panel.

FIG. 1A is a schematic diagram showing the structure of an AMOLED display panel in the related art. As shown in FIG. 1A, the AMOLED display panel includes: a first substrate 11 and a second substrate 12 disposed opposite to each other; organic light emitting units and a cathode protection layer 15 which are arranged between the first substrate 11 and the second substrate 12; and a touch structure 17 disposed on the first substrate 11. The organic light emitting units each include an anode 132 and an organic light emitting block 131 stacked with the anode 132, and the organic light emitting units share a common cathode 14 which is in a planar shape and covers substantially the entire second substrate 12. The first substrate 11 and the second substrate 12 are adhered together by frame adhesives 16 and form an AMOLED display structure together with the organic light emitting units. The cathode protection layer 15 and the cathode 14 between the two first and second substrates. As shown in FIG. 1A, the touch structure 17 is integrated with the AMOLED display structure together in the On-Cell manner, and the touch structure 17 includes at least two touch layers which may be located on different layers or the same layer and are electrically insulated from each other.

Figure 1B:
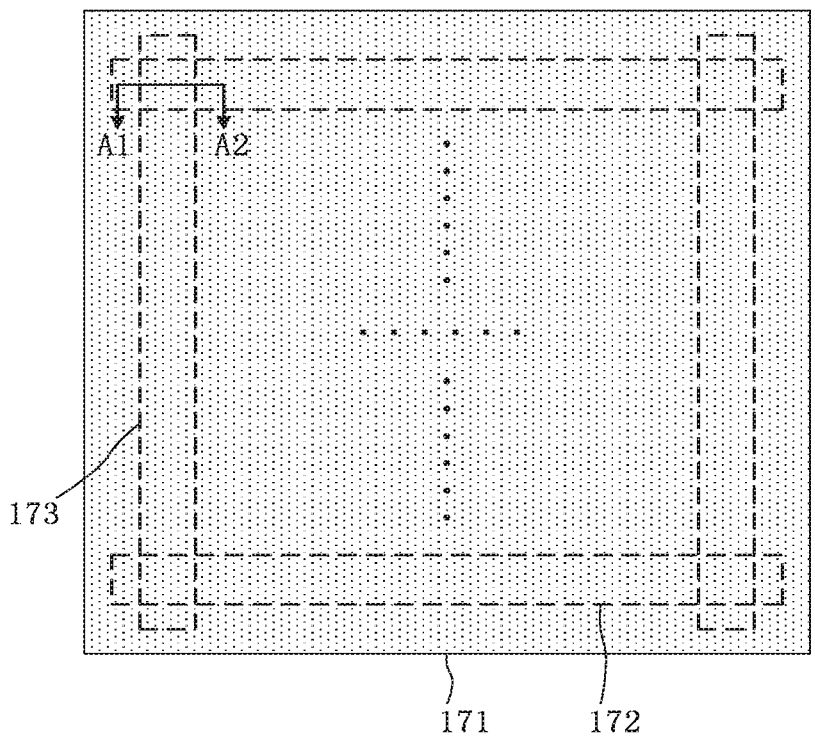
FIG. 1B is a top view of a touch structure on a first substrate in FIG. 1A.

FIG. 1B is a top view of a touch structure on the first substrate in FIG. 1A. As shown in FIG. 1B, the touch structure includes a first passivation layer 171, and a first touch layer formed by a plurality of first touch electrodes 172 and a second touch layer formed by a plurality of second touch electrodes 173 both below the first passivation layer 171, where the first touch electrodes 172 intersect the second touch electrodes 173 and are electrically insulated from the second touch electrodes 173.

Figure 1C:
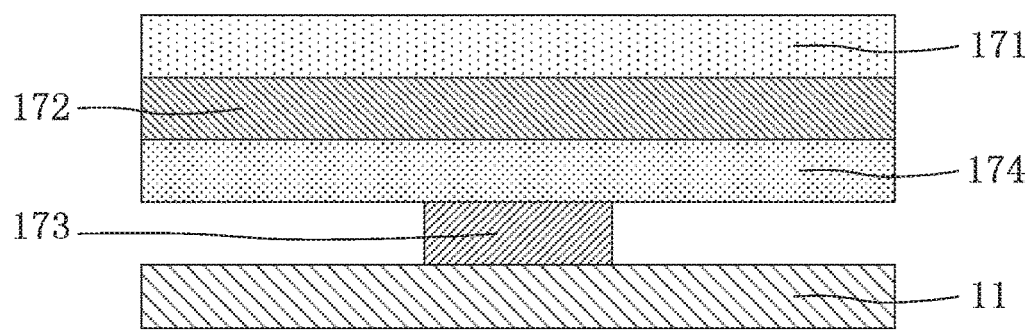
FIG. 1C is a schematic cross-sectional diagram of the touch structure in FIG. 1B taken along a direction of A1-A2.

The first touch electrodes 172 and the second touch electrodes 173 may be located on different layers, referring to FIG. 1C which shows a schematic cross-sectional diagram of the touch structure in FIG. 1B taken along a direction of A1-A2. As shown in FIG. 1C, the touch structure on the first substrate 11 includes, in sequence, a second touch layer formed by a plurality of second touch electrodes 173, a second passivation layer 174, a first touch layer formed by a plurality of first touch electrodes 172 and a first passivation layer 171. The electric insulation between the first touch electrodes 172 and the second touch electrodes 173 is achieved by the second passivation layer 174. Alternatively, the first touch electrodes 172 and the second touch electrodes 173 may be located on the same layer, referring to FIG. 1D which shows a schematic cross-sectional diagram of a touch structure in FIG. 1B taken along a direction of A1-A2. Being different from FIG. 1C, FIG. 1D shows that the first touch electrodes 172 and the second touch electrodes 173 are located on the same layer, that is, the touch layers respectively formed by the first touch electrodes 172 and the second touch electrodes 173 are also located on the same layer, where the first touch electrodes 172 cross the second touch electrodes 173 by bridges 175 at the intersections between the first touch electrodes 172 and the second touch electrodes 173.

Figure 1D:
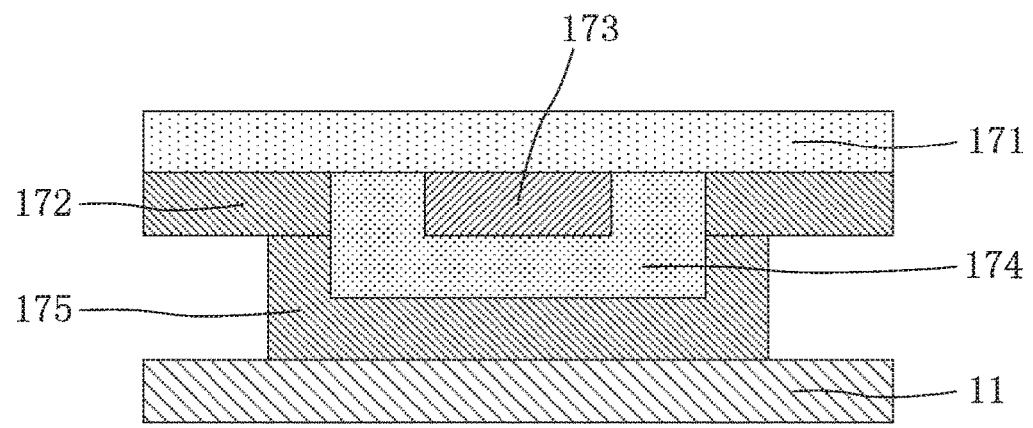
FIG. 1D is another schematic cross-sectional diagram of the touch structure in FIG. 1B taken along a direction of A1-A2.

As for the structure of the AMOLED display panel shown in FIG. 1A, electromagnetic interference occurs between the touch structure 17 and the cathode 15 during operation of the AMOLED display panel, so that the display effect and the touch control effect of the AMOLED display panel are affected; in addition, regardless of the structure shown in FIG. 1C or 1D, the touch structure 17 is generally formed by a photolithographic process. In manufacturing the structures shown in FIGS. 1C and 1D, processes of film forming, adhesive applying, exposing, developing, etching and stripping are conducted for four times, resulting in lots of manufacturing processes; moreover, one photo mask is needed for each manufacturing process, resulting in a high production cost.

Figure 2:
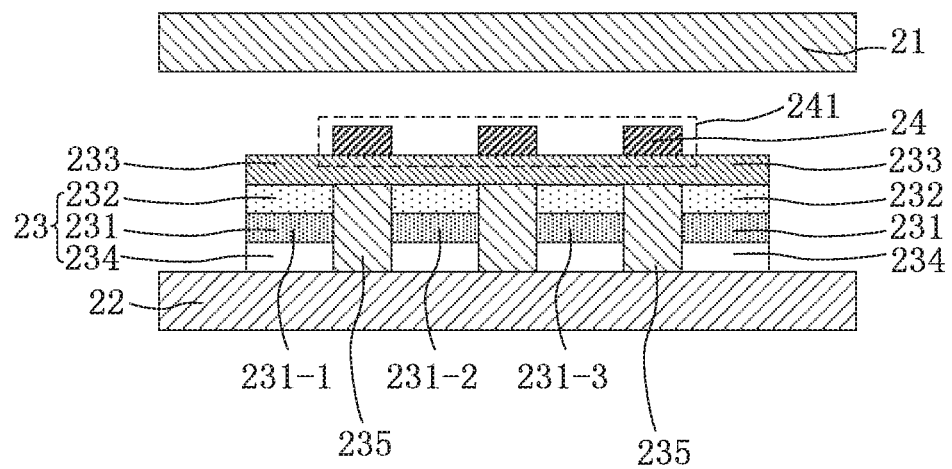
FIG. 2 is a schematic diagram showing the structure of a touch panel, according to embodiments of the present disclosure.

In view of the above, solutions are provided by embodiments of the present disclosure. A touch panel is provided according to embodiments of the present disclosure, and FIG. 2 is a schematic diagram showing the structure of the touch panel according to embodiments of the present disclosure. Referring to FIG. 2, the touch panel includes: a first substrate 21 and a second substrate 22 disposed opposite to each other and organic light emitting units 23 located between the first substrate 21 and the second substrate 22. The organic light emitting units 23 are arranged in rows and columns, and are separated by a pixel definition layer 235. The organic light emitting units 23 each include an anode 234 and an organic light emitting block 231 which are stacked together. The anode 234 and the organic light emitting block 231 are block-shaped. One or more rows of organic light emitting units 23 share a strip-shaped cathode 232, and the strip-shaped cathode 232 is common to the one or more rows of organic light emitting units 23. The strip-shaped cathodes 232 are arranged in a first direction (namely the row direction) and each extend in a second direction (namely a column direction). FIG. 2 exemplarily shows a configuration in which each strip-shaped cathode 232 corresponds to one row of organic light emitting units 23. The organic light emitting block 231 is sandwiched between the strip-shaped cathode 232 and the anode 234. In an exemplary embodiment, the organic light emitting block 231 is in direct contact with the cathode 232, and is in direct contact with the anode 234. In an alternative embodiment, an electron-transport layer is arranged between the organic light emitting block 231 and the cathode 232, and a hole-transport layer is arranged between the organic light emitting block 231 and the anode 234. The touch panel further includes a first touch layer 241. The first touch layer 241 is located between the first substrate 21 and the second substrate 22 and includes a plurality of first touch electrodes 24, a projection of which on the second substrate 22 in a direction perpendicular to the second substrate 22 is located between projections of two adjacent cathodes 232. It should be noted that the projection prefers to the projection in the perpendicular direction, i.e. the projection in a direction perpendicular to the display panel. By at least disposing the first touch layer for the touch control function between the first substrate and the second substrate, forming the cathode 232 into a strip shape, and disposing the projection, on the second substrate 22, of the first touch electrode 24 between two adjacent cathodes 232, the cathodic layer is staggered relative to the first touch layer, therefore a coupled parasitic capacitance formed between the cathode layer and the first touch layer may be eliminated, and electromagnetic interference between the first touch layer and the cathodes 232 may be reduced compared to the related art, so that the display effect and the touch control effect may be improved. In addition, both the first touch layer and the organic light emitting units 23 may be formed by an evaporation process since the organic light emitting units 23 is also disposed between the first substrate 21 and the second substrate 22, therefore manufacturing processes may be reduced compared to the photolithographic process of forming the first touch layer and the organic light emitting units 23 in the related art; moreover, the production cost may be reduced by using an evaporation mask in the manufacturing processes compared to the photo mask used in the related art.

When the organic light emitting unit 23 is in forward bias, some of electrons injected into the organic light emitting block 231 and some holes injected into the organic light emitting block 231 recombine in the organic light emitting block 231, and photons are generated. The wavelength of the emitted light is determined by the bandgap of the material of the organic light emitting block 231. In an exemplary embodiment, the organic light emitting units 23 include a red organic light emitting unit, a green organic light emitting unit, and a blue organic light emitting unit. In the red organic light emitting unit, red light is emitted in the recombining of the electrons and holes in the red organic light emitting block 231-1. In the green organic light emitting unit, green light is emitted in the recombining of the electrons and holes in the red organic light emitting block 231-2. In the blue organic light emitting unit, blue light is emitted in the recombining of the electrons and holes in the red organic light emitting block 231-3.

In some embodiments, the organic light emitting units 23 may include a common cathode protection layer 233. The cathode protection layer 233 has a planar shape and is located on the cathodes 232. It should be noted that an upward direction refers to a direction from the second substrate 22 to the first substrate 21, and a downward direction refers to a direction opposite to the upward direction, where terms such as "on" and "below" describe relative orientation of items which may be in direct contact or indirect contact.

Further, the touch panel further includes a second touch layer including a plurality of second touch electrodes, and the second touch layer and the first touch layer are correspondingly disposed to implement the touch control function of the touch panel. The second touch layer may be located at different locations which are shown below for example in embodiments of the present disclosure.

Figure 3A:
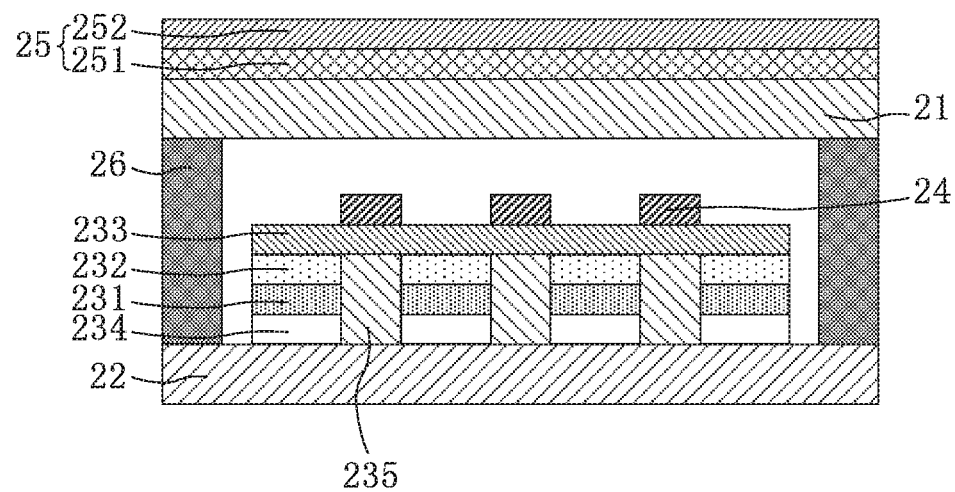
FIG. 3A is a schematic diagram showing the structure of another touch panel, according to embodiments of the present disclosure.

The second touch layer may be located at an outward side of the first substrate. Referring to FIG. 3A, a second touch layer 25 is located on a surface of the first substrate 21 which is away from the second substrate 22, and the second touch layer 25 further includes a first passivation layer 252 on second touch electrodes 251. Moreover, the first substrate 21 provided with the second touch layer 25 may be adhered together with the second substrate 22 provided with the organic light emitting units 23 and the first touch layer through frame adhesives 26.

Figure 3B:
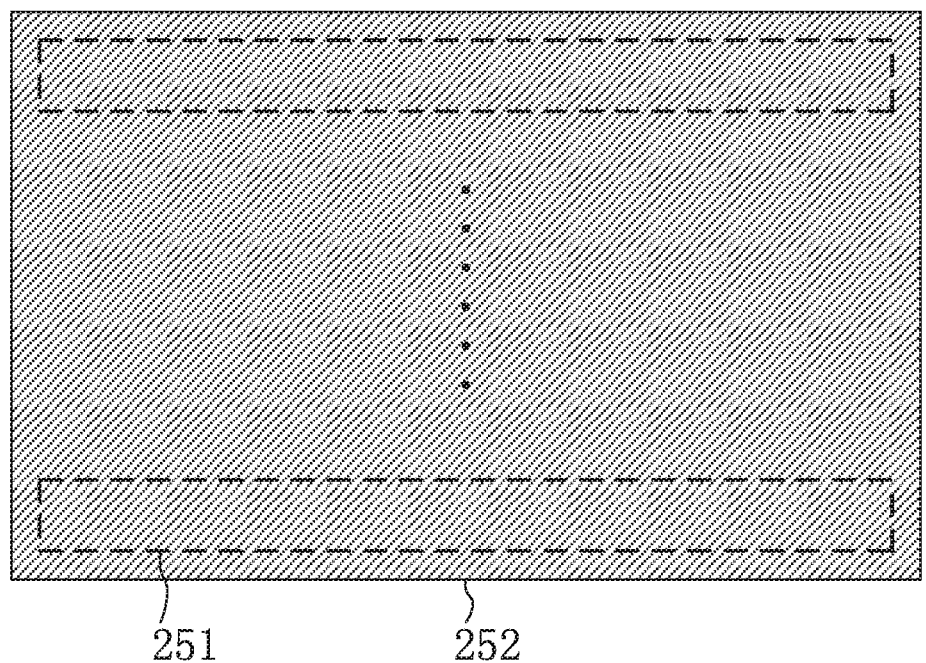
FIG. 3B is a top view of a second touch layer in FIG. 3A.
Figure 3C:
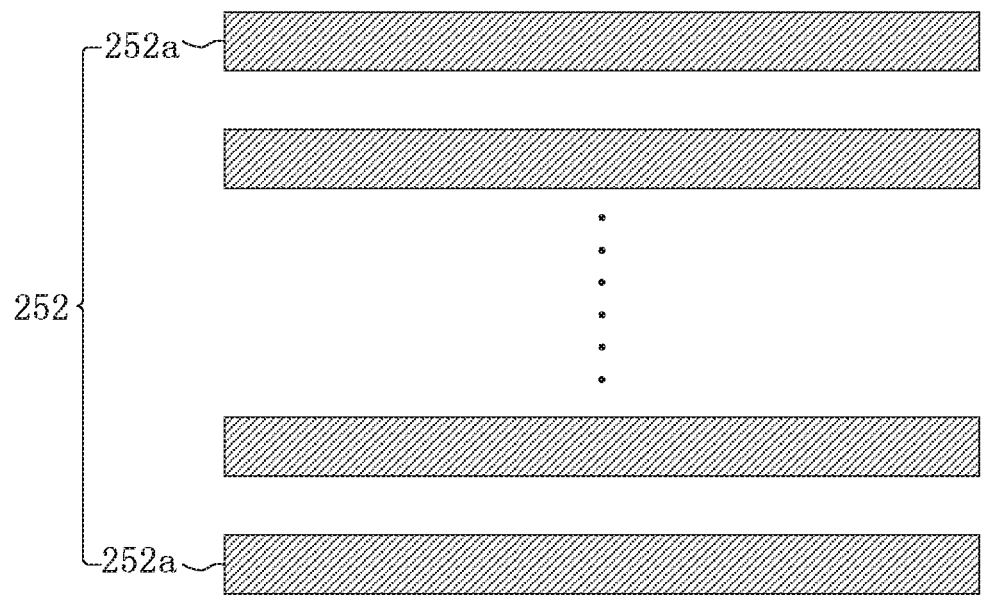
FIG. 3C is a top view of another second touch layer in FIG. 3A.

The first passivation layer 252 of the second touch layer 25 in FIG. 3A may be an integral structure in a planar shape, as shown in for example FIG. 3B. As shown in FIG. 3B, the first passivation layer 252 in a planar shape is located on the second touch electrode 251, and this is merely an example of the structure of the first passivation layer 252. In another example, referring to FIG. 3C, the first passivation layer 252 may further include a plurality of first passivation units 252a on the second touch electrodes 251. Compared to the structure shown in FIG. 3A, the second touch electrode 251 and the first passivation unit 252a shown in FIG. 3C may be formed by adopting the same photo mask to perform lithography, thus further reducing not only manufacturing processes but also production cost.

Figure 3D:
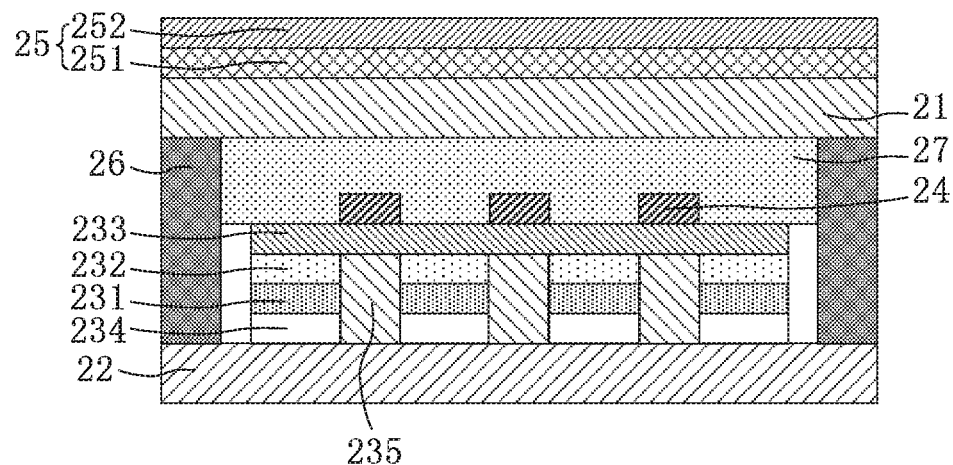
FIG. 3D is a schematic diagram showing the structure of a touch panel, according to embodiments of the present disclosure.

Further, referring to FIG. 3D, the touch panel shown in FIG. 3A may further include a first dielectric layer 27, which is filled between the first touch layer formed by the first touch electrodes 24 and the first substrate 21. By filling the first dielectric layer 27, thickness of a box formed by aligning and adhering the first substrate 21 to the second substrate 22 is well controlled, and the organic light emitting units 23 are better protected. In addition, since a dielectric constant of the first dielectric layer 27 is greater than that of air, the touch control effect of the touch panel may be further improved.

Figure 3E:
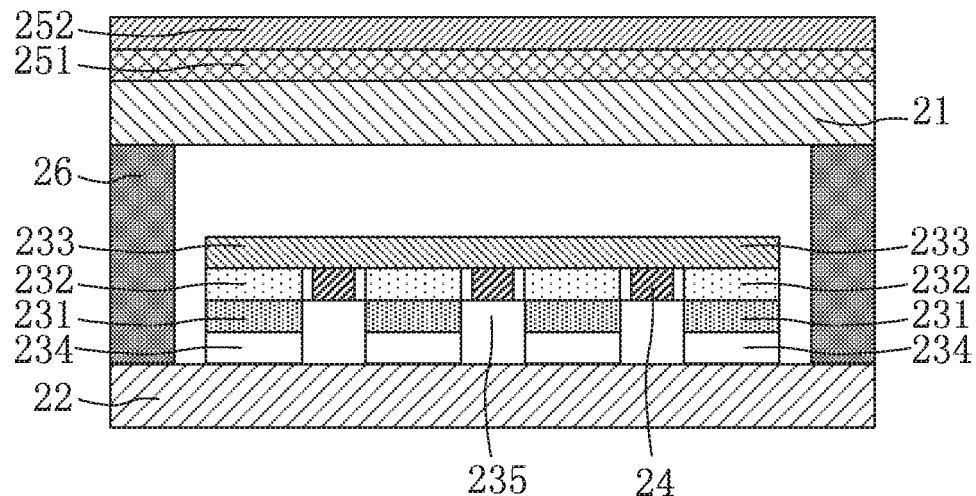
FIG. 3E is a schematic diagram showing the structure of another touch panel, according to embodiments of the present disclosure.
Figure 3F:
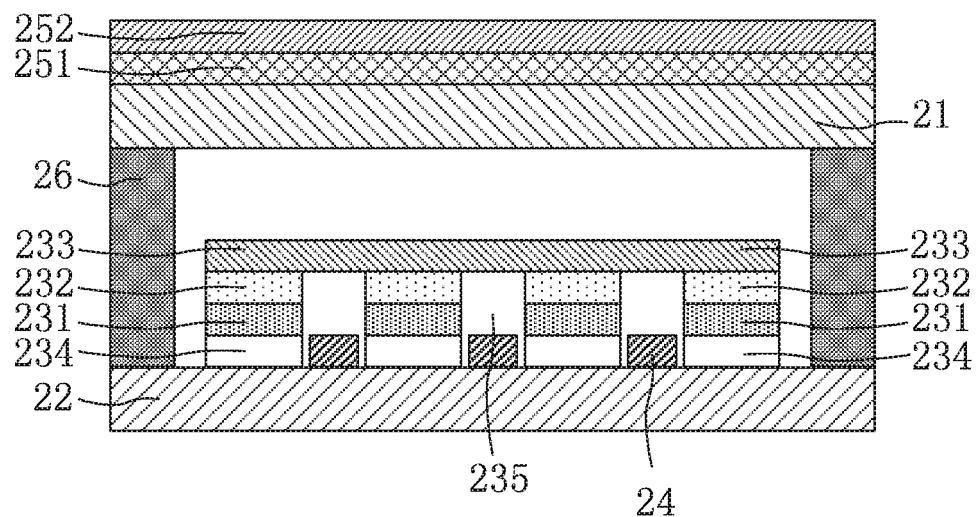
FIG. 3F is a schematic diagram showing the structure of another touch panel, according to embodiments of the present disclosure.

In all the above embodiments, each of the first touch electrodes 24 of the first touch layer is located on the cathode protection layer 233, a perpendicular projection of the first touch electrode 24 on the second substrate 22 is located between projections of two adjacent cathodes 232, and the first touch electrode 24 is electrically insulated from the cathode 232 through the cathode protection layer 233. Besides the above configuration of the first touch layer, the first touch layer may be alternatively disposed on other films of the organic light emitting units. In an alternative embodiment, referring to FIG. 3E, the first touch electrodes 24 forming the first touch layer are located on the same layer with the cathodes 232, the first touch electrode 24 is located between two adjacent ones of the stripe-shaped cathodes 232 and located directly on the pixel definition layer 235 between two adjacent organic light emitting units 231, and the first touch electrode 24 is electrically insulated from the cathode 232. In another alternative embodiment, referring to FIG. 3F, the first touch electrodes 24 are located on the same layer with the anodes 234, and are covered by the pixel definition layer 235. Each of the first touch electrodes 24 is located between two adjacent anodes 234. In addition, in the touch panel shown in FIGS. 3E and 3F, the first dielectric layer may also be filled between the cathode protection layer 233 and the first substrate 21, like the structure of the touch panel shown in FIG. 3D, which is not described again here.

Figure 4A:
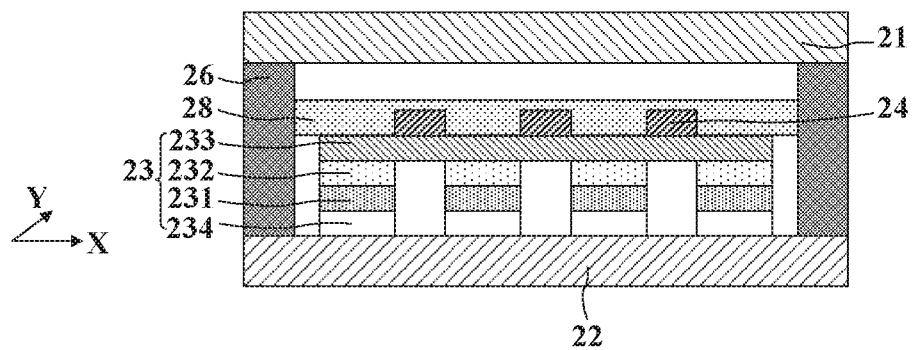
FIG. 4A is a schematic diagram showing the structure of another touch panel, according to embodiments of the present disclosure.
Figure 4B:
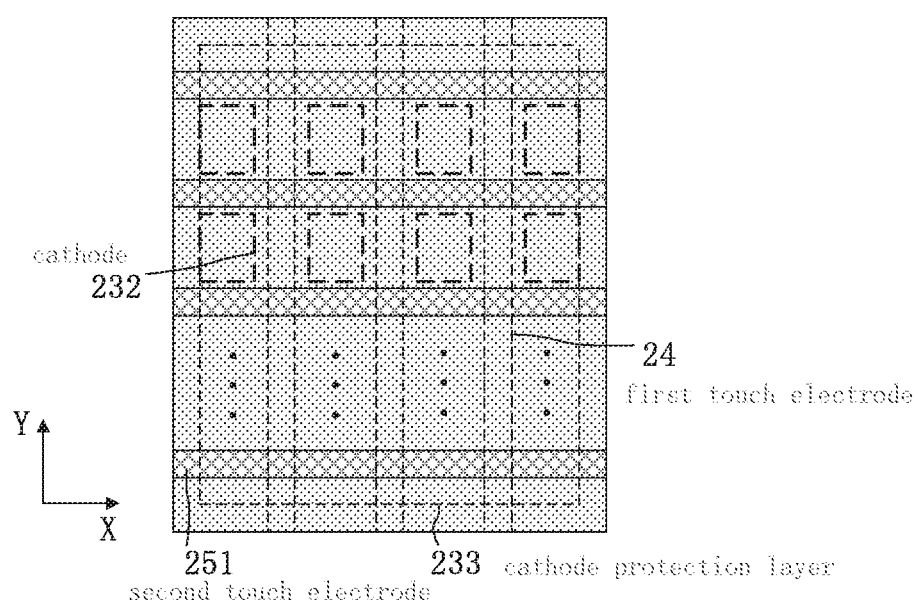
FIG. 4B is a top view showing a first touch layer, a second touch layer and a cathode layer in FIG. 4A.

Besides the above embodiments in which the second touch layer is located at the outward side of the first substrate, the second touch layer may be alternatively located between the first substrate and the second substrate. As shown in FIG. 4A, the first touch electrodes 24 are located on the cathode protection layer 233, a perpendicular projection of the first touch electrode 24 on the second substrate 22 is located between projections of two adjacent ones of the cathodes 232 arranged along a direction X (namely the first direction), and the first touch electrodes 24 are electrically insulated from the cathodes 232 through the cathode protection layer 233. FIG. 4B is a top view of the first touch electrodes 24, the second touch electrodes and the organic light emitting units in FIG. 4A. As shown in FIG. 4B, the first touch electrodes 24 are arranged in the first direction (x direction) and extend in the second direction (y direction), the second touch electrodes 251 are arranged in the second direction and each extend in the first direction. 251 The second touch electrodes 251 are located over the first touch electrodes 24 and is between the first substrate 21 and the second substrate 22. The second touch electrodes 251 are electrically insulated from the first touch electrodes 24 through a first insulating layer 28. A perpendicular projection of each of the second touch electrodes 251 on the second substrate 22 is located between projections of two adjacent ones of the cathodes 232 which are arranged along the direction Y. By disposing the second touch electrodes between the first substrate and the second substrate, disposing the second touch electrodes and the first touch electrodes in different layers, and disposing the perpendicular projection, on the second substrate 22, of the second touch electrode 251 between projections of two adjacent cathodes 232 arranged along the direction Y, the cathodes are staggered relative to the second touch electrodes, therefore a coupled parasitic capacitance formed between the cathodes and the first touch electrodes may be eliminated and, compared to the related art, electromagnetic interference between the second touch electrodes and the cathodes 232 may be reduced, so that the display effect and the touch control effect may be further improved. In addition, both the second touch electrodes and the organic light emitting units may be formed by an evaporation process by using an evaporation mask, therefore manufacturing processes and production cost may be further reduced compared to forming the second touch electrodes by using a photo mask.

Figure 4C:
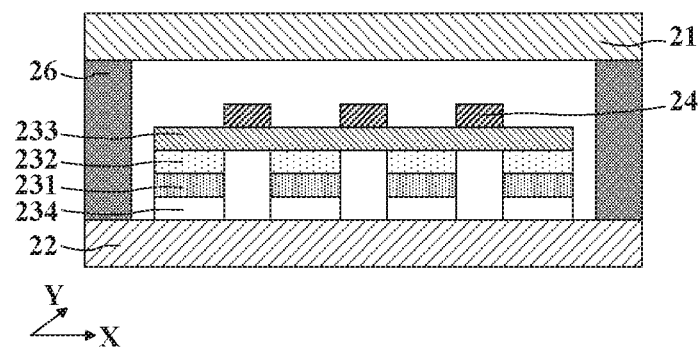
FIG. 4C is a schematic diagram showing the structure of another touch panel, according to embodiments of the present disclosure.
Figure 4D:
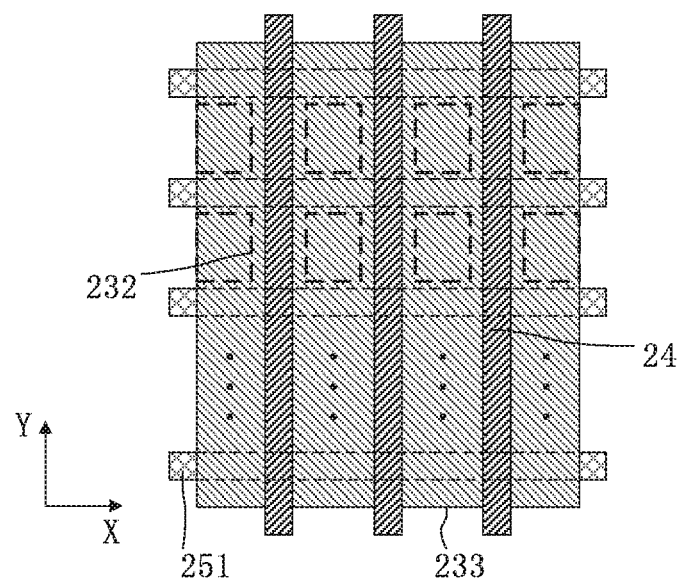
FIG. 4D is a top view of a first touch layer, a second touch layer and a cathode layer in FIG. 4C.
Figure 4E:
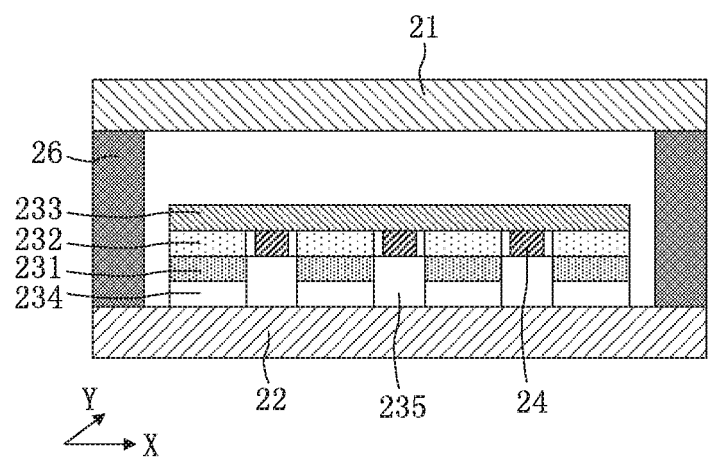
FIG. 4E is a schematic diagram showing the structure of another touch panel, according to embodiments of the present disclosure.
Figure 4F:
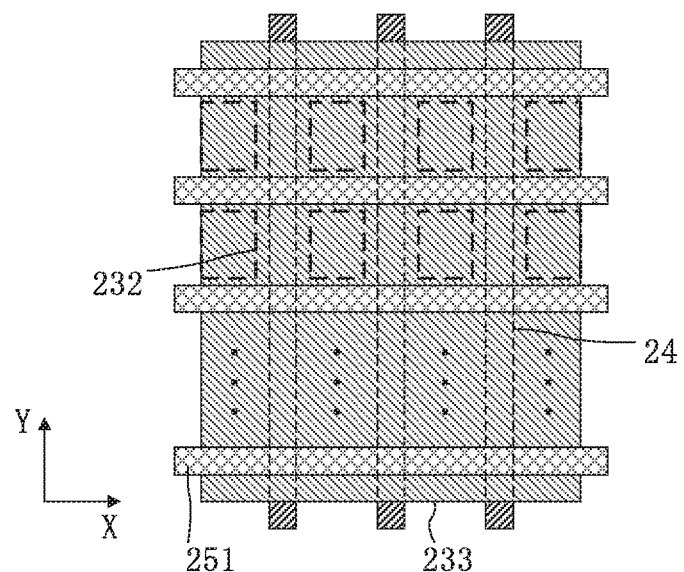
FIG. 4F is a top view showing a first touch layer, a second touch layer and a cathode layer in FIG. 4E.

The structure shown in FIGS. 4A and 4B is an example in which the second touch electrodes is located between the first substrate 21 and the second substrate 22, and the second touch electrodes and the first touch electrodes are located on different layers. In other examples, the first touch electrodes and the second touch electrodes may also be located at any location between the first substrate and the second substrate as long as the first touch layer and the second touch layer are not located on the same layer. For example, as shown in FIG. 4C, the first touch electrodes 24 are located on the cathode protection layer 233, a projection of the first touch electrode 24 on the second substrate 22 is located between projections of two adjacent cathodes 232 arranged along the direction X, and the first touch electrode 24 is electrically insulated from the cathode 232 through the cathode protection layer 233. FIG. 4D is a top view of the first touch electrodes 24, the second electrodes 251 and the organic light emitting units in FIG. 4C. As shown in FIG. 4D, the first touch electrodes 24 are arranged in the first direction (namely the direction X) and extend in the second direction (namely the direction Y), the second touch electrodes 251 are arranged in the second direction and each extend in the first direction. The second touch electrode 251 is located on the second substrate 22 and located on the same layer with anodes 234, a projection of the second touch electrode 251 on the second substrate 22 is located between projections of two adjacent cathode 232 on the second substrate 22. In an alternative embodiment, as shown in FIG. 4E, the first touch electrodes 24 is located on the same layer with the cathodes 232, the first touch electrode 24 is located between two adjacent cathodes 232 arranged along the direction X and the first touch electrode 24 is directly located on the pixel definition layer 235, and the first touch electrode 24 is electrically insulated from the cathode 232. FIG. 4F is a top view of the first touch electrodes 24, the second touch electrodes 251 and the cathodes 232 in FIG. 4E. As shown in FIG. 4F, the first touch electrodes 24 are arranged in the first direction (direction X) and extend in the second direction (direction Y), the second touch electrodes 251 are arranged in the second direction and each extend in the first direction. The second touch electrode 251 is located above the cathode 232, a projection of the second touch electrode 251 on the second substrate 22 is located between projections of two adjacent cathodes 232 arranged along the direction of Y, and the second touch electrode 251 is electrically insulated from the first touch electrode 24 and the cathode 232 through the cathode protection layer 233.

Figure 5A:
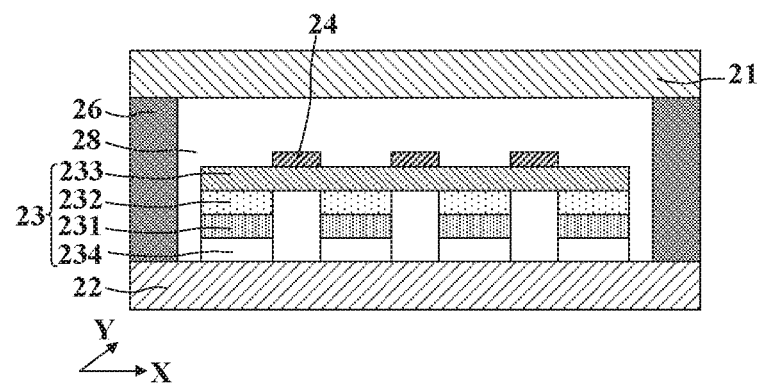
FIG. 5A is a schematic diagram showing the structure of another touch panel, according to embodiments of the present disclosure.
Figure 5B:
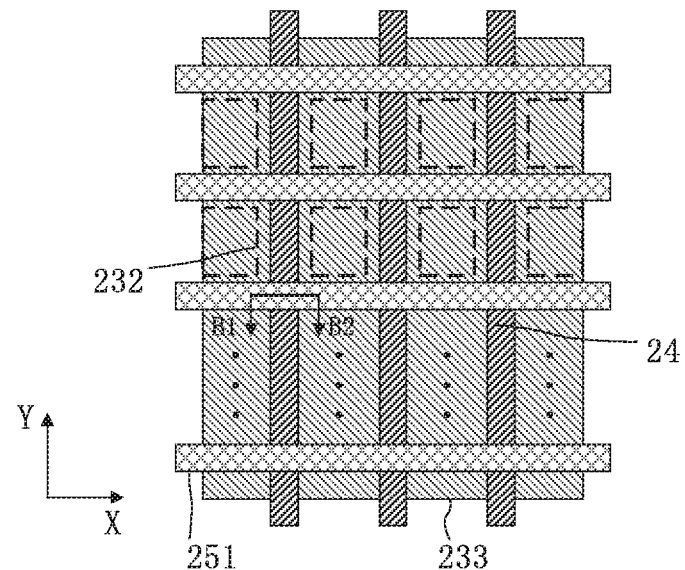
FIG. 5B is a top view of a first touch layer, a second touch layer and a cathode layer in FIG. 5A.
Figure 5C:
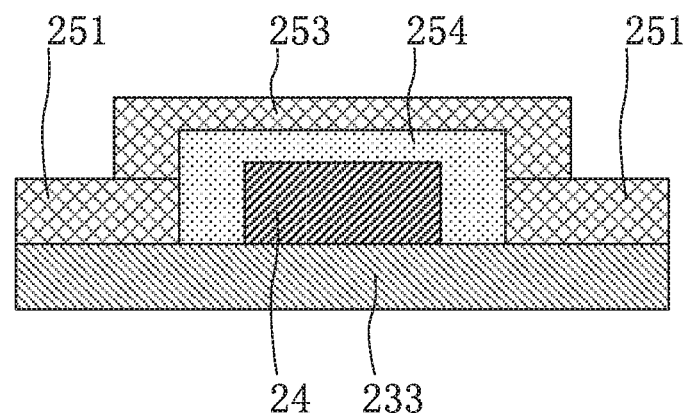
FIG. 5C is a schematic cross-sectional diagram of the first touch layer, the second touch layer and the cathode protection layer in FIG. 5B taken along a direction of B1-B2.

Besides the case that the second touch electrodes and the first touch electrodes are located on different layers, the second touch electrodes and the first touch electrodes may also be located on the same layer. As shown in FIG. 5A, the first touch electrodes 24 are located on the cathode protection layer 233, and a projection of the first touch electrode 24 on the second substrate 22 is located between two adjacent cathodes 232 arranged along the direction X. FIG. 5B is a top view of the first touch electrodes, the second touch electrodes and the organic light emitting units in FIG. 5A. As shown in FIG. 5B, the first touch electrodes 24 are arranged in the first direction (direction X) and extend in the second direction (direction Y), the second touch electrodes 251 are arranged in the second direction and each extend in the first direction. The second touch electrodes 251 and the first touch electrodes 24 are located on the same layer and both located on the cathode protection layer 233, and a projection of the second touch electrode 251 on the second substrate 22 is located between projections of two cathodes 232 which are adjacent in the direction Y. FIG. 5C is a schematic cross-sectional diagram of the first touch electrode, the second touch electrode and the cathode protection layer 233 in FIG. 5B taken along a line B1-B2. As shown in FIG. 5C, since the first touch electrode 24 crosses the second touch electrode 251 and is located in the same layer with the second touch sub-electrode 251, each second touch electrode 251 would be divided into a plurality of segments and the segments of each second touch electrode 251 are electrically connected through bridges 253, and the second touch electrode 251 is electrically insulated from the first touch electrode 24 through a second insulating layer 254. By disposing the second touch electrodes between the first substrate and the second substrate, disposing the second touch electrodes and the first touch electrodes in the same layer, and disposing the projection, on the second substrate 22, of the second touch electrode 251 between projections of two adjacent cathodes 232 arranged along the direction Y, the cathodes are staggered relative to the second touch electrodes, therefore a coupled parasitic capacitance formed between the cathodes and the first touch electrodes may be eliminated and, compared to the related art, electromagnetic interference between the second touch electrodes and the cathodes 232 may be reduced, so that display effect and touch control effect may be further improved. In addition, the second touch electrodes and the cathodes may be formed by an evaporation mask to perform evaporating, therefore manufacturing processes and production cost may be further reduced compared to forming the second touch electrodes by using a photo mask.

Figure 5D:
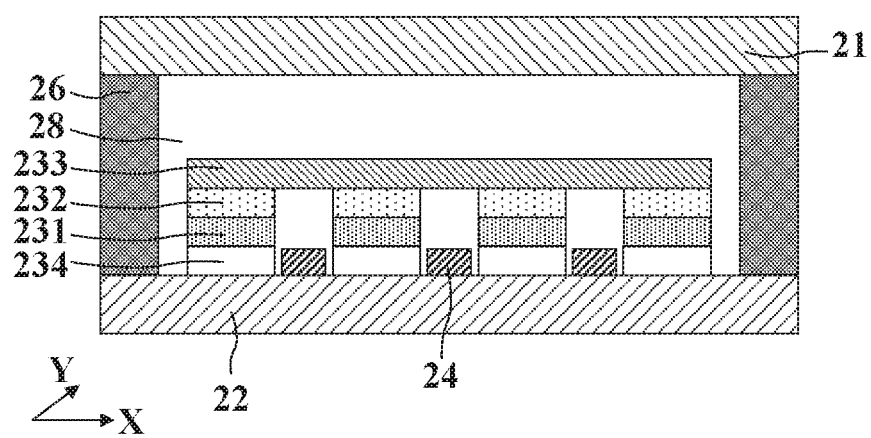
FIG. 5D is a schematic diagram showing the structure of another touch panel, according to embodiments of the present disclosure.
Figure 5E:
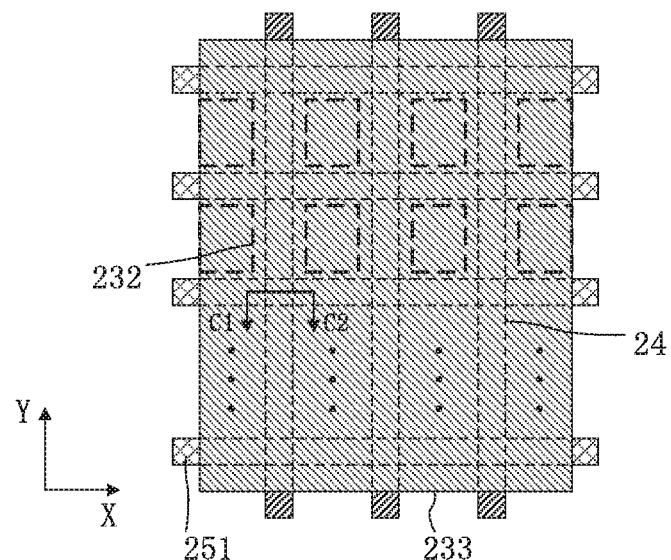
FIG. 5E is a top view of a first touch layer, a second touch layer and a cathode layer in FIG. 5D.
Figure 5F:
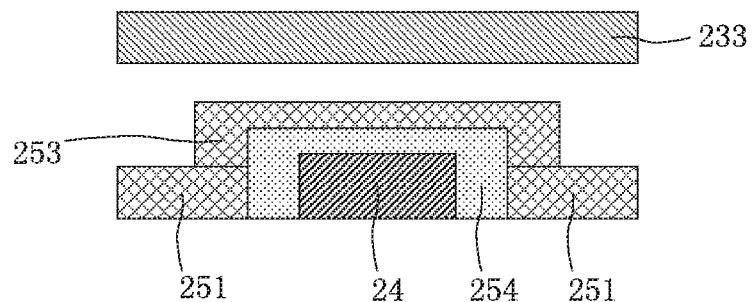
FIG. 5F is a schematic cross-sectional diagram of the first touch layer, the second touch layer and the cathode protection layer in FIG. 5E taken along a direction of C1-C2.

The structure shown in FIGS. 5A to 5C is one example in which the second touch electrodes 251 is located between the first substrate 21 and the second substrate 22, and the second touch electrodes 251 and the first touch electrodes 24 are located on the same layer. In another example, as shown in FIG. 5D, the first touch electrodes 24 forming the first touch layer is located on the second substrate 22 and located on the same layer with anodes 234 of the organic light emitting units, and a projection of the first touch electrode 24 on the second substrate 22 is located between projections of two adjacent cathodes 232 arranged along the direction X. FIG. 5E is a top view of the first touch electrodes, the second touch electrodes and the organic light emitting units in FIG. 5D, as shown in FIG. 5E, the first touch electrodes 24 are arranged in the first direction (direction X) and extend in the second direction (direction Y), the second touch electrodes 251 are arranged in the second direction and each extend in the first direction. The second touch electrode 251 is located on the same layer with anodes 234 of the organic light emitting units, i.e. the second touch electrodes 251 and the first touch electrodes 24 are located on the same layer, and a projection of the second touch electrode 251 on the second substrate 22 is located between projections of two adjacent cathodes 232 arranged along the direction Y. FIG. 5F is a schematic cross-sectional diagram of the first touch electrode, the second touch electrode and the cathode protection layer 233 in FIG. 5E taken along a line C1-C2, as shown in FIG. 5F, since the first touch electrode 24 crosses the second touch electrode 251 and is located in the same layer with the second touch electrode 251, each second touch electrode 251 would be divided into a plurality of segments and the segments of each second touch electrode 251 are electrically connected through bridges 253, and the second touch electrode 251 is electrically insulated from the first touch electrode 24 through a second insulating layer 254.

In the above embodiments, the first substrate 21 may be formed of Cover Lens or Cover Glass, and the second substrate 22 may be an array substrate.

In the above embodiments, metal material or transparent conductive material may be preferred to be adopted for the first touch electrodes and the second touch electrodes, where the transparent conductive material may be any one of or a combination of Indium Tin Oxide (ITO), Indium Zinc Oxide (IZO) or Indium Gallium Zinc Oxide (IGZO). Further, material of the first touch electrode on the first touch layer can be metal material. Since line resistance of metal manufactured by adopting an evaporation process is less than that of the transparent conductive material, the first touch layer manufactured by metal material makes better touch control effect.

Figure 6A:
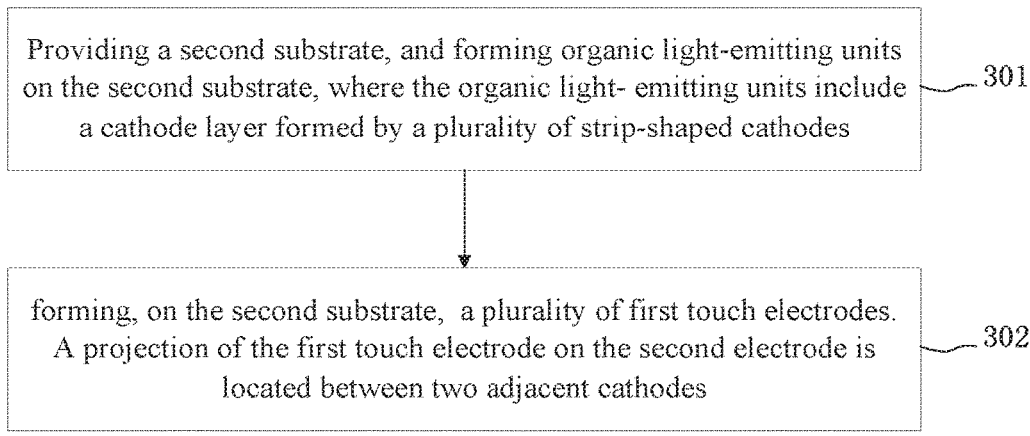
FIG. 6A is a schematic flow diagram of a manufacturing method of a touch panel, according to embodiments of the present disclosure.
Figure 6B:
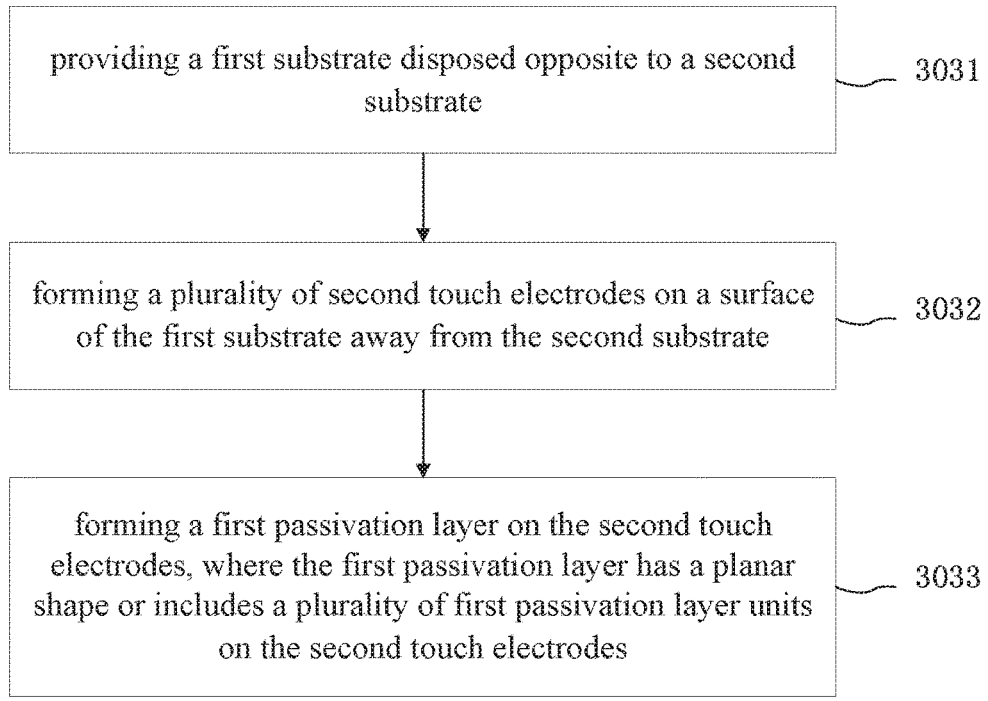
FIG. 6B is a schematic flow diagram of a manufacturing method of a second touch layer in a touch panel, according to embodiments of the present disclosure.

A manufacturing method of a touch panel is further provided according to embodiments of the present disclosure. FIG. 6A is a schematic flow diagram of a manufacturing method of a touch panel provided by embodiments of the present disclosure. Referring to FIG. 6A, the manufacturing method of the touch panel includes following steps.

Step 301: providing a second substrate, and forming organic light emitting units on the second substrate, where the organic light emitting units includes at least a cathode layer formed by a plurality of strip-shaped cathodes;

Step 302: forming, on the second substrate, a first touch layer including a plurality of first touch electrodes. A projection of each first touch electrode on the second substrate is located between projections of two adjacent cathodes.

Further, in some embodiments, each of the organic light emitting units further includes: an organic light emitting block and an anode. The organic light emitting units share a common cathode protection layer. The organic light emitting block is sandwiched between the cathode and the anode, and the cathode protection layer has a planar shape and is formed on the cathode layer.

In some embodiments, both the organic light emitting units and the first touch electrodes are preferred to be formed by fine metal mask. Manufacturing processes and production cost may be reduced by technical solutions of the present disclosure compared to the first touch electrodes in the related art which is needed to be formed by adopting a photo mask and a photolithographic process.

It should be noted that the touch panel may further include a first substrate and second touch electrodes besides a structure manufactured through above steps, and the second touch electrodes may be located on one side of the first substrate or between the first substrate and the second substrate as long as a touch control function can be achieved by the second touch electrodes and the first touch electrodes. Embodiments of a manufacturing method of the second touch electrodes are provided below on the base of FIG. 6A.

In some embodiments, referring to FIG. 6A, the manufacturing method of the second touch electrodes in a touch panel may include following steps.

Step 3031: providing a first substrate disposed opposite to a second substrate;

step 3032: forming a plurality of second touch electrodes on a surface of the first substrate facing away from the second substrate;

step 3033: forming a first passivation layer on the second touch electrodes, where the first passivation layer has a planar shape or includes a plurality of first passivation units on the second touch electrodes.

To enable better control to thickness of a box during box aligning and adhering of the first substrate and the second substrate, play a better protection role for the organic light emitting units, and further improve touch control effect of the touch panel, the manufacturing method of the touch panel may further include: forming a first dielectric layer between the first touch electrodes and the first substrate.

Figure 6C:
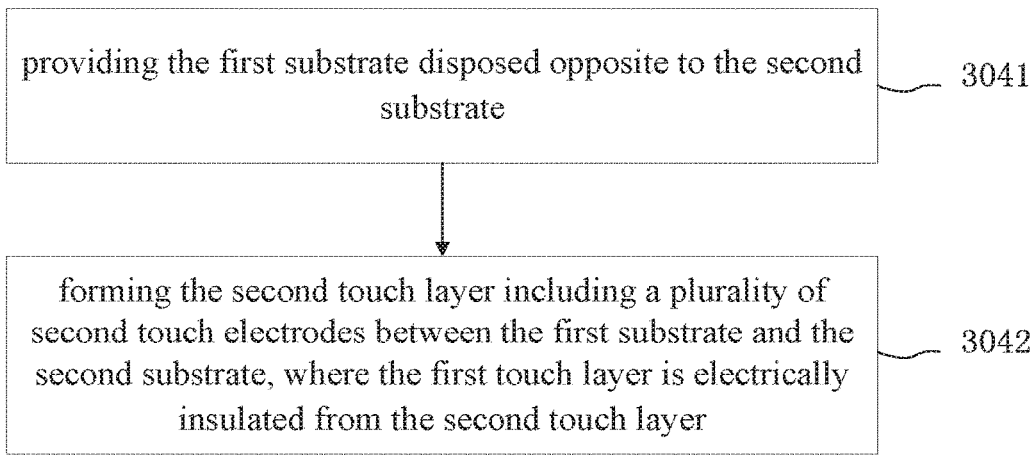
FIG. 6C is a schematic flow diagram of a manufacturing method of a second touch layer in another touch panel, according to embodiments of the present disclosure.

By steps 3031 to 3033, the second touch electrodes is manufactured on a surface of the first substrate facing away from the second substrate. In addition, the second touch electrodes may also be manufactured between the first substrate and the second substrate. Referring to FIG. 6C, a manufacturing method, in which the second touch electrodes may also be disposed between the two substrates, of the touch panel may include following steps.

Step 3041: providing the first substrate disposed opposite to the second substrate.

Step 3042: forming the second touch electrodes between the first substrate and the second substrate, where the first touch electrodes are electrically insulated from the second touch electrodes.

Further, a projection of the second touch electrode on the second substrate is located between projections of two adjacent cathodes.

Figure 7:
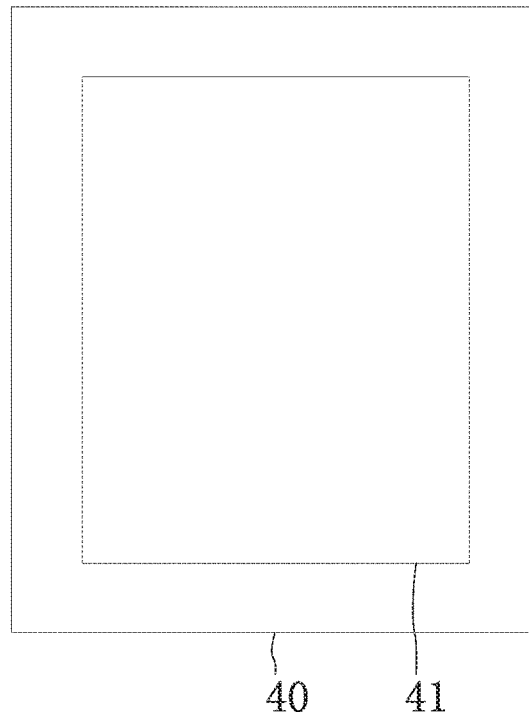
FIG. 7 is a schematic diagram showing the structure of a display device, according to embodiments of the present disclosure.
Figure 8:
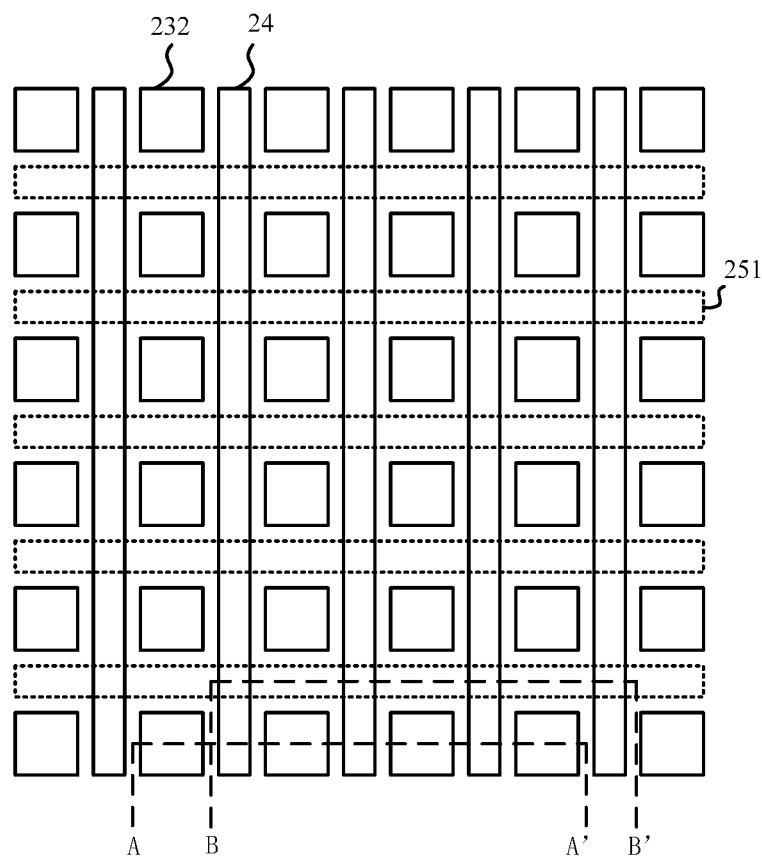
FIG. 8 is a top view of the cathode blocks, the first touch electrodes, and the second touch electrodes, according to embodiments of the present disclosure.
Figure 9:
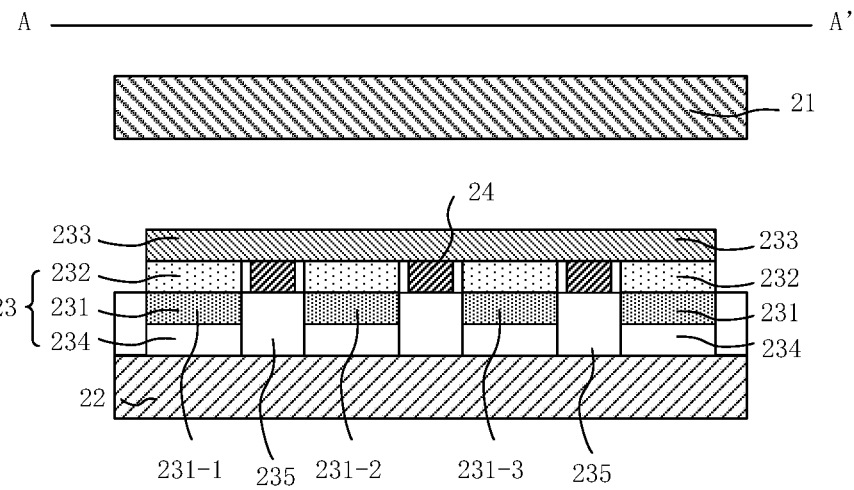
FIG. 9 is a cross sectional view taken along the line A-A' in FIG. 8.
Figure 10:
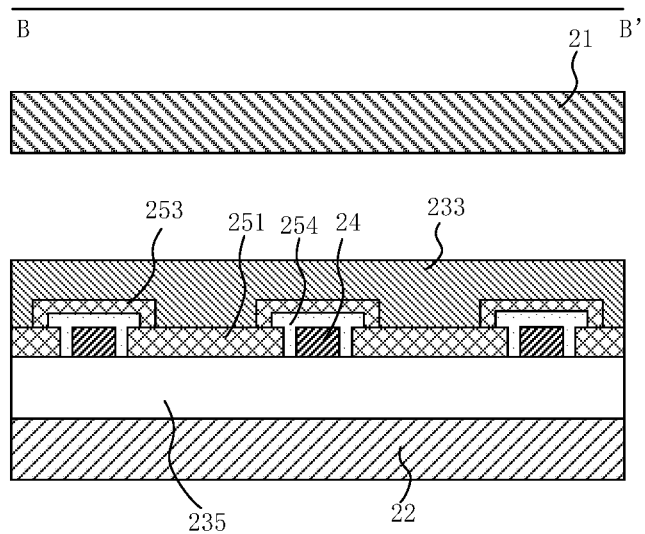
FIG. 10 is a cross sectional view taken along the line B-B' in FIG. 8.

A display device is further provided by embodiments of the present disclosure. FIG. 7 is a schematic diagram showing the structure of a display device provided by embodiments of the present disclosure, referring to FIG. 7, a display device 40 includes a touch panel 41, and may further include a driving circuit and other components supporting the display device 40 to operate normally. The touch panel 41 is a touch panel described in above embodiments. The display device 40 may be one of a mobile phone, a tablet computer, an electronic paper and a digital photo frame.

As for the touch panel, manufacturing method thereof and display device provided by embodiments of the present disclosure, by at least disposing the first touch layer achieving touch control function between the first substrate and the second substrate, disposing the cathode into a strip shape, and disposing the projection, on the second substrate, of the first touch electrode between projections of two adjacent cathodes, at least electromagnetic interference between the first touch electrodes and the cathode can be reduced, so that display effect and touch control effect may be improved. In addition, the first touch electrodes and the cathodes may be formed by an evaporation process since the cathodes is also disposed between the first substrate and the second substrate, thus reducing not only manufacturing processes but also production cost.

Note that the above are only some embodiments and adopted technical principles of the present disclosure. It can be understand by those skilled in the art that the present disclosure is not limited to the specific embodiments described here, and various apparent modification, readjustment and replacement can be performed for those skilled in the art without depart from the protection scope of the present disclosure. Therefore, though the present disclosure is described in detail through above embodiments, the present disclosure is not limited to the above embodiments, other more equivalent embodiments may be further included without depart from the conception of the present disclosure, and the scope of the present disclosure is determined by the scope of attached claims.

Various modifications and additions can be made to the exemplary embodiments discussed without departing from the scope of the present disclosure. For example, while the embodiments described above refer to particular features, the scope of this disclosure also includes embodiments having different combinations of features and embodiments that do not include all of the described features. Accordingly, the scope of the present disclosure is intended to embrace all such alternatives, modifications, and variations as fall within the scope of the claims, together with all equivalents thereof.

We claim:

1. A touch panel, comprising:
a first substrate and a second substrate disposed opposite to each other;
a plurality of anode blocks arranged on the second substrate, wherein the plurality of anode blocks are arranged in rows and columns and are separated by a pixel definition layer;
a plurality of organic light emitting blocks, each of which is disposed on a respective one of the plurality of anode blocks, wherein the plurality of organic light emitting blocks are separated by the pixel definition layer;
a plurality of cathode blocks, each of which is disposed on a respective one of the plurality of organic light emitting blocks;
a plurality of strip-shaped first touch electrodes arranged in a first direction and each extending in a second direction; and
a plurality of strip-shaped second touch electrodes arranged in the second direction and each extending in the first direction;
wherein the plurality of cathode blocks, the plurality of strip-shaped second touch electrodes, and the plurality of strip-shaped first touch electrodes are arranged in a same layer, each of the plurality of strip-shaped first touch electrodes is located between two adjacent columns of cathode blocks, the plurality of strip-shaped first touch electrodes are directly on the pixel definition layer, and the first direction is substantially perpendicular to the second direction,
wherein the plurality of strip-shaped second touch electrodes are directly on the pixel definition layer, each of the plurality of strip-shaped second touch electrodes is located between two adjacent rows of cathode blocks, and each of the plurality of strip-shaped second touch electrodes is divided into multiple segments which are electrically connected through bridges.

2. The touch panel according to claim 1, wherein a projection of each of the plurality of strip-shaped second touch electrodes on the second substrate is located between projections of two adjacent rows of cathode blocks on the second substrate.

3. The touch panel according to claim 1, wherein the first substrate has a first surface facing the second substrate and a second surface facing away from the second substrate, and the plurality of strip-shaped second touch electrodes are arranged on the second surface of the first substrate.

4. The touch panel according to claim 3, further comprising: a passivation layer on the plurality of strip-shaped second touch electrodes.

5. The touch panel according to claim 3, further comprising: a cathode protection layer covering the plurality of cathode blocks and the plurality of strip-shaped first touch electrodes.

6. The touch panel according to claim 1, further comprising: a cathode protection layer covering the plurality of cathode blocks and the plurality of strip-shaped first touch electrodes.

7. The touch panel according to claim 6, wherein the plurality of strip-shaped second touch electrodes arranged on the cathode protection layer.

* * * * *